(12) United States Patent
Winstead et al.

(10) Patent No.: US 8,884,358 B2
(45) Date of Patent: Nov. 11, 2014

(54) METHOD OF MAKING A NON-VOLATILE MEMORY (NVM) CELL STRUCTURE

(71) Applicants: Brian A. Winstead, Austin, TX (US); Sung-Taeg Kang, Austin, TX (US); Marc A. Rossow, Austin, TX (US)

(72) Inventors: Brian A. Winstead, Austin, TX (US); Sung-Taeg Kang, Austin, TX (US); Marc A. Rossow, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/748,808

(22) Filed: Jan. 24, 2013

(65) Prior Publication Data

US 2014/0203347 A1    Jul. 24, 2014

(51) Int. Cl.
*H01L 29/66* (2006.01)
*H01L 29/423* (2006.01)
*H01L 29/40* (2006.01)

(52) U.S. Cl.
CPC .......... *H01L 29/401* (2013.01); *H01L 29/4234* (2013.01)
USPC ............................ 257/325; 257/288; 438/267

(58) Field of Classification Search
USPC ................................... 257/288, 325; 438/267
See application file for complete search history.

(56) References Cited

U.S. PATENT DOCUMENTS

| | | | |
|---|---|---|---|
| 7,517,747 B2 | 4/2009 | Muralidhar et al. | |
| 2005/0142751 A1* | 6/2005 | Jung | 438/257 |
| 2006/0063333 A1* | 3/2006 | Jeon et al. | 438/267 |
| 2007/0218633 A1* | 9/2007 | Prinz et al. | 438/267 |
| 2008/0076221 A1* | 3/2008 | Kang et al. | 438/267 |
| 2009/0166712 A1* | 7/2009 | Muralidhar et al. | 257/321 |
| 2009/0256186 A1* | 10/2009 | Kang et al. | 257/314 |
| 2009/0256191 A1* | 10/2009 | White et al. | 257/319 |
| 2011/0233655 A1* | 9/2011 | Shimizu et al. | 257/325 |
| 2012/0135596 A1* | 5/2012 | Kang et al. | 438/594 |
| 2012/0292683 A1* | 11/2012 | Loiko et al. | 257/316 |

* cited by examiner

*Primary Examiner* — A. Sefer
(74) *Attorney, Agent, or Firm* — James L. Clingan, Jr.; Mary Jo Bertani

(57) ABSTRACT

A non-volatile memory device includes a substrate and a charge storage layer. The charge storage layer comprises a bottom layer of oxide, a layer of discrete charge storage elements on the bottom layer of oxide, and a top layer of oxide on the charge storage elements. A control gate is on the top layer of oxide. A surface of the top layer of oxide facing a surface of the control gate is substantially planar.

17 Claims, 7 Drawing Sheets

US 8,884,358 B2

METHOD OF MAKING A NON-VOLATILE MEMORY (NVM) CELL STRUCTURE

BACKGROUND

1. Field

This disclosure relates generally to semiconductor manufacturing, and more specifically, to the making of NVM cells.

2. Related Art

Non-volatile memories (NVMs), which are a major portion of the semiconductor industry, are often found on integrated circuits that have one or more processing units. One of the characteristics of NVM cells is that writing cells includes both erasing and programming. Both of these operations typically require higher voltages, commonly significantly higher, than are required for general purpose circuits such as the logic transistors used for providing a processing unit. Also, both programming and erasing require significantly more time than reading. Thus, there is the continuing effort to reduce the voltages required for programming and erase and reduce the time for performing those functions. In the case of erasing, which is typically removing electrons from a storage layer. In the case of nanocrystals being used for the storage layer, this is achieved using tunneling and that is most commonly done using top erase in which electrons tunnel from the nanocrystals to the overlying control gate.

For the erase then, a sufficiently high voltage must be applied to the control gate to achieve the tunneling. An issue though is that eventually electrons can tunnel from the substrate under the nanocrystals to the nanocrystals counteracting the tunneling from the top side. Eventually an equilibrium can be reached in which the rate of tunneling from the substrate to the nanocrystals equals the rate of tunneling from the nanocrystals to the control gate and in effect, there is no further erasing occurring because there is no net loss of electrons in the nanocrystals. This acts to limit the erase and also increase the time to erases.

Accordingly there is a need to provide further improvement in one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a dielectric between a storage layer of nanocyrstals has an interface between the dielectric and a control gate that is substantially planar instead of conformal to the underlying nanocrystals which is the normal condition absent special conditioning to arrive at the planar condition. Also the thickness of the dielectric is relatively thin directly over the nanocrystals. The result is reduced capacitance between the control gate and the nanocrystals for a given dielectric thickness directly over the nanocrystals. Thus, the region directly over the nanocrystals is relatively thin for ease of tunneling but the capacitance is minimized for this thickness by avoiding having the control gate conformal with the nanocrystals. This is better understood by reference to the specification and the drawings.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
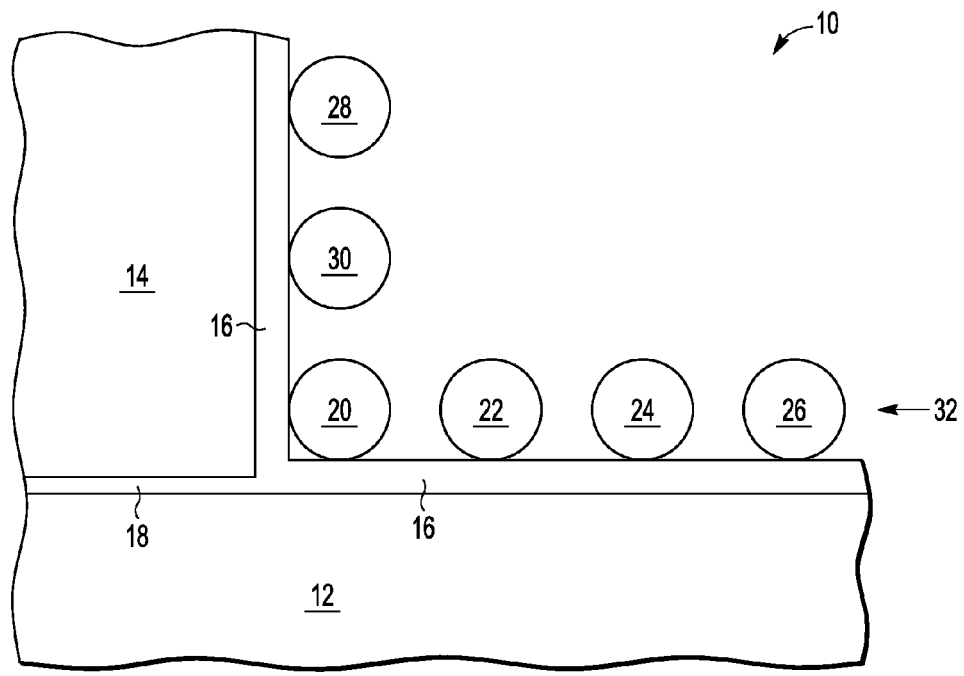
FIG. 1 is a cross section of an NVM cell structure at a stage in processing according to a first embodiment.

Shown in FIG. 1 is a non-volatile memory (NVM) cell structure 10 having a substrate 12, a dielectric layer 18 over substrate 12, a select gate 14 over dielectric layer 18, a dielectric layer 16 over substrate 12 in an area adjacent to dielectric layer 18 and along a sidewall of select gate 14, nanocrystals 20, 22, 24, and 26 laterally over dielectric layer 16 where dielectric layer 16 is over substrate 12, and nanocrystals 28 and 30 on dielectric layer 16 along the sidewall of select gate 14. Nanocrystals 20, 22, 24, 26, 28, and 30 comprise a plurality of nanocrystals 32. Dielectric layer 18 may be thermal oxide that is grown at high temperature. Dielectric layer 16 may be a thermal oxide that causes oxide growth on the sidewall of select gate 14 and may be thicker on the sidewall due to the select gate in the case of select gate 14 being polysilicon. Dielectric layer 18 may be about 30 Angstroms in thickness. Dielectric layer 16 may be about 60 Angstroms in thickness. Nanocrystals 32 may each have a diameter of about 120 Angstroms. NVM cell structure 10 of FIG. 1 is a structure from which multiple embodiments may be developed.

Figure 2:
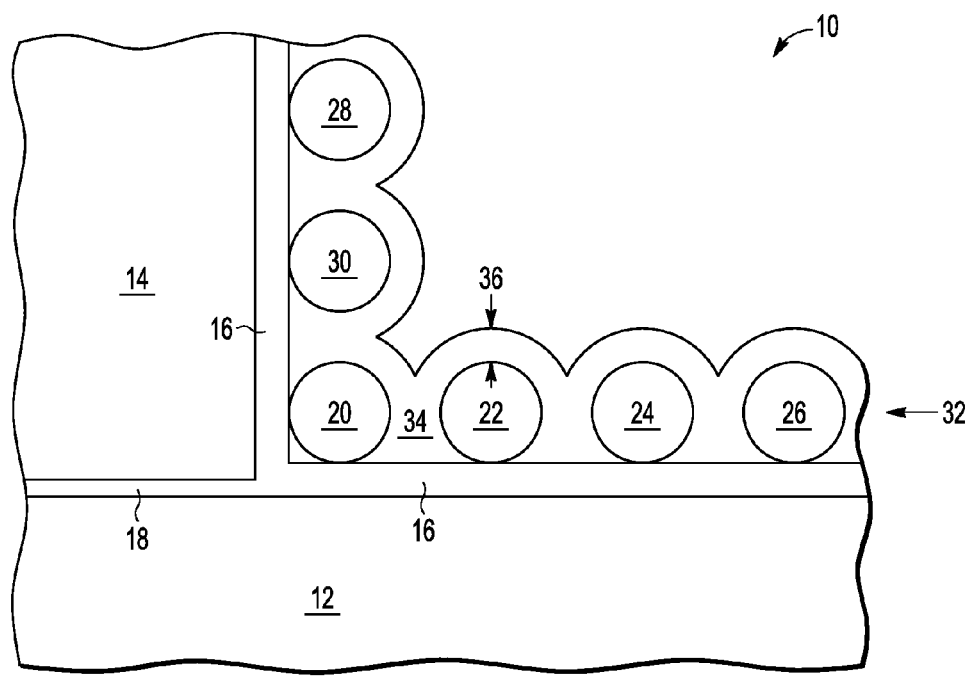
FIG. 2 is a cross section of the NVM cell structure of FIG. 1 at a subsequent stage in processing.

Shown in FIG. 2 is NVM cell structure 10 after depositing a dielectric layer 34 over nanocrystals 32. Dielectric layer 34 may be a conformal high temperature oxide. Dielectric layer 34 has a thickness 36 above nanocrystals 32. Particularly shown is nanocrystal 22 as a example of thickness 36 being directly over a nanocrystal. Thickness 36 may be about 40 Angstroms. High temperature oxide can have parameters adjusted to obtain conformality or planar behavior and various degrees between those two behaviors. For more planar, higher temperature and higher pressure are used, and a higher concentration of disilane is used. The quality of the oxide is better for conformal high temperature oxide.

Figure 3:
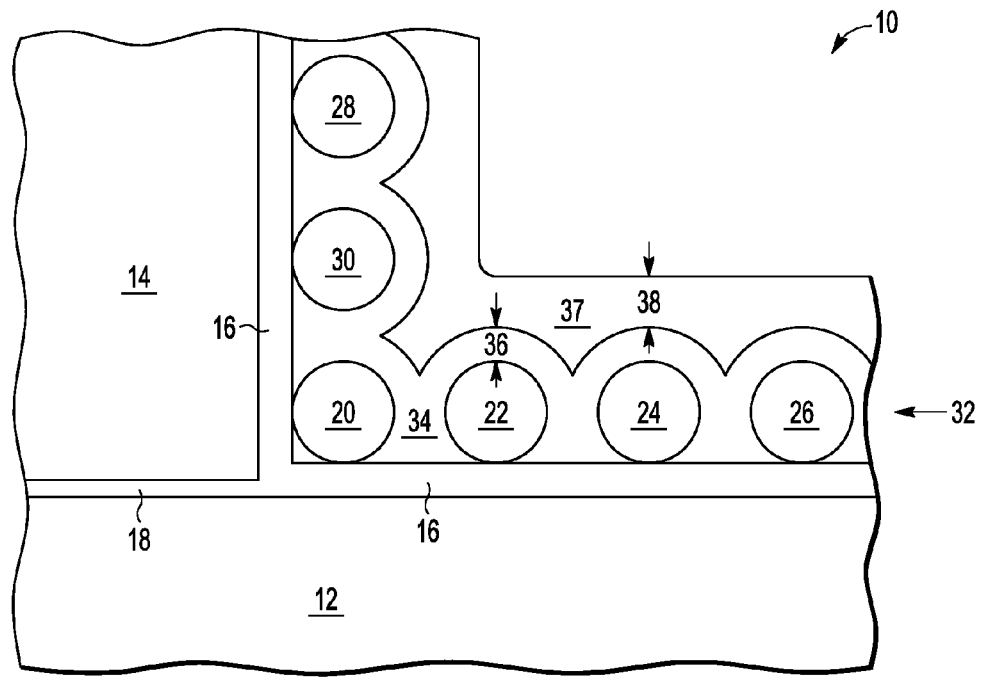
FIG. 3 is a cross section of the NVM cell structure of FIG. 2 at a subsequent stage in processing.

Shown in FIG. 3 is NVM cell structure 10 after depositing a dielectric layer 37 that is planar meaning that it is tends to fill in the gaps with a resulting surface that is much more planar than would occur by forming a layer that is conformal. Dielectric layer 37 may be high temperature oxide in which the parameters are selected so that its behavior is planar. Dielectric layer 37 has a thickness directly above the nanocrystals of about 40 Angstroms. The example of this is shown with nanocrystal 24 in which a thickness 38 of dielectric layer 37 is shown directly above nanocrystal 24. Thickness 38 may be about 40 Angstroms. Dielectric layer 37 is substantially planar in the horizontal direction of nanocrystals 20, 22, 24, and 26. Dielectric layer 37 would be thinner vertically along nanocrystals 28 and 30 than horizontally over nanocrystals 20, 22, 24, and 26.

Figure 4:
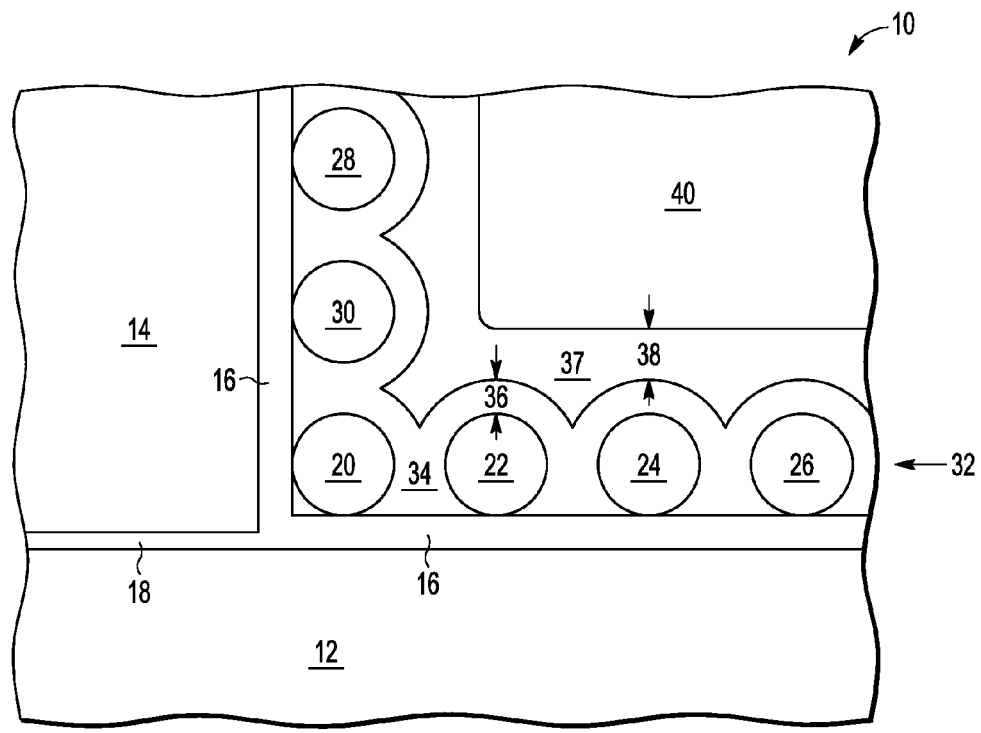
FIG. 4 is a cross section of the NVM cell structure of FIG. 3 at a subsequent stage in processing.

Shown in FIG. 4 is NVM cell structure 10 after forming a control gate 40 over dielectric layer 37. This shows that the interface between dielectric layer 37 and control gate 40 is substantially planar in the horizontal direction. The horizontally aligned nanocrystals are the ones that will have electrons present as a result of being programmed. Nanocrystals 28 and 30 are essentially irrelevant in terms of passing charge for programming and erasing. The distance from each of the horizontal nanocrystals to control gate 40 is thickness 36 plus distance 38 which is 40 Angstroms plus 40 Angstroms which equals 80 Angstroms.

Figure 5:
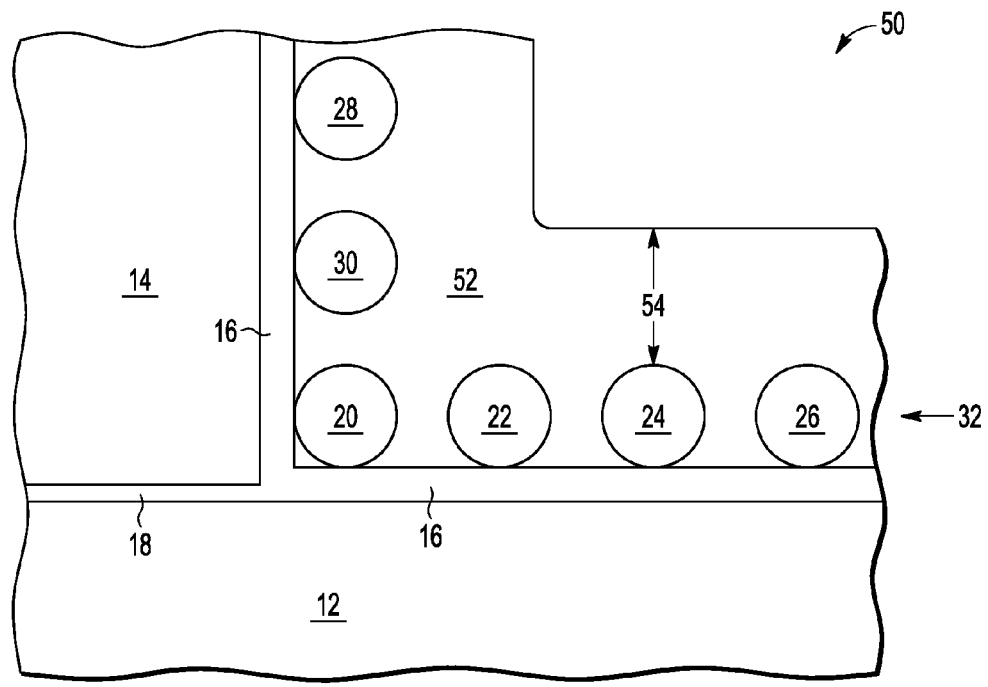
FIG. 5 is a cross section of the NVM cell structure of FIG. 4 at a subsequent stage in processing.

Shown in FIG. 5 is an NVM cell structure 50 after a dielectric 52 has been deposited on the NVM cell structure 10 of FIG. 1. Dielectric 52 is a high temperature oxide that is deposited using substantially conformal parameter settings but due to the thickness, is substantially planar. The distance to the top surface of dielectric layer 52 from the top of a horizontal nanocrystal is a thickness 54 which may be about 200 Angstroms. The example is this case of FIG. 5 is from the top of nanocrystal 24 to the top surface of dielectric layer 52 of FIG. 5.

Figure 6:
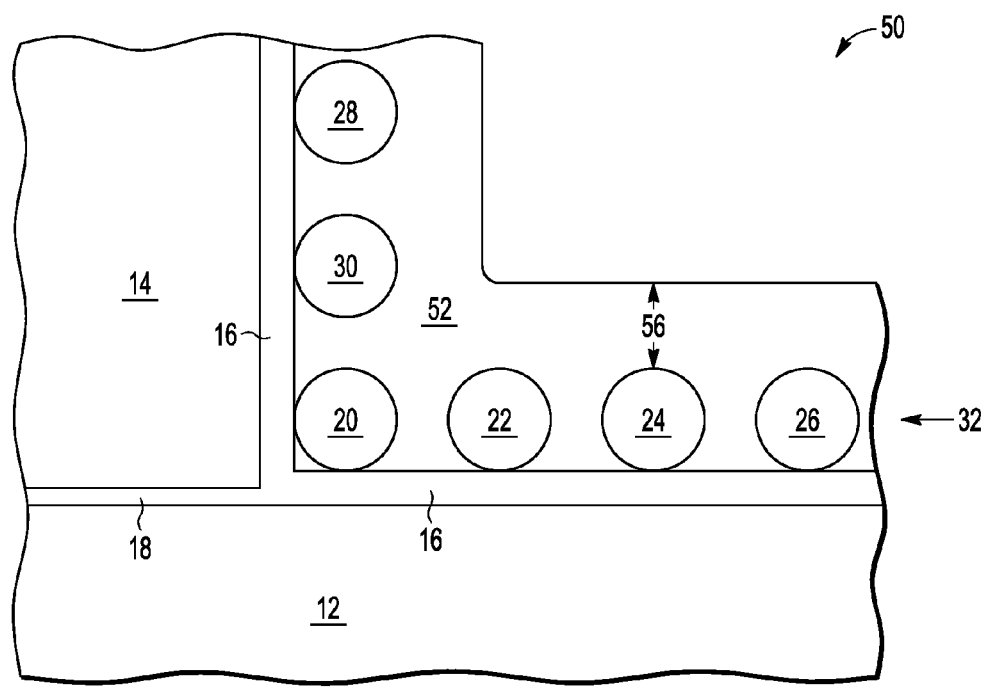
FIG. 6 is a cross section of an NVM cell structure at a stage in processing according to a second embodiment.

Shown in FIG. 6 is NVM cell structure 50 after an etch back which reduces the thickness of dielectric layer 52 to have a top surface over the horizontal nanocrystals to a thickness 56 which may be 80 Angstroms. This etch back may be isotropic. The etchback itself tends to increase the planarity of the top surface of dielectric layer 52.

Figure 7:
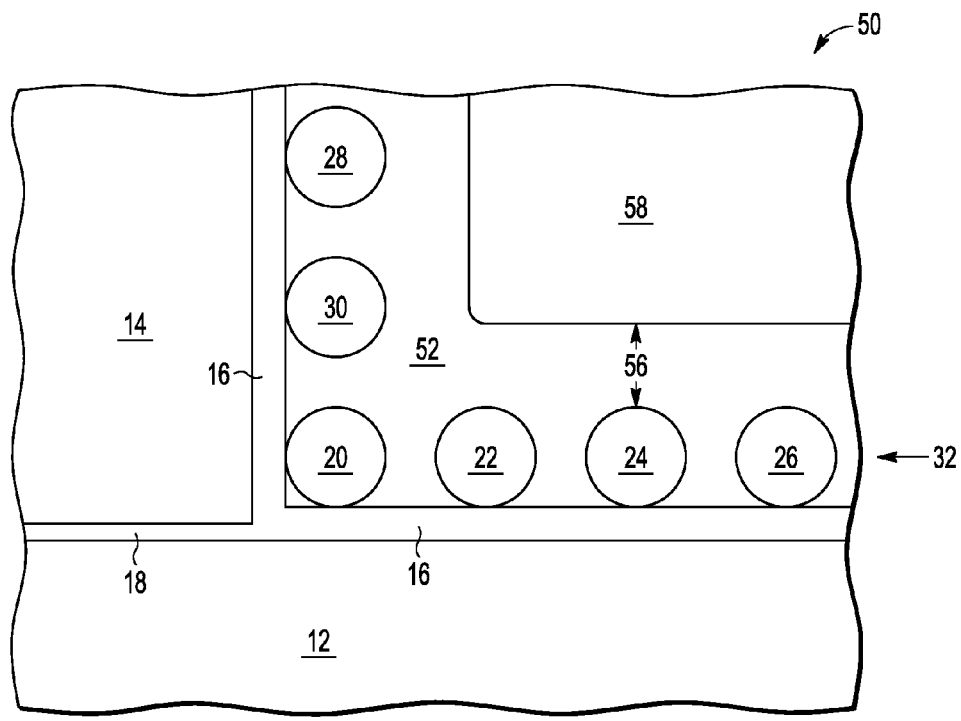
FIG. 7 is a cross section of the NVM cell structure of FIG. 6 at a subsequent stage in processing.

Shown in FIG. 7 is NVM cell structure 50 after forming a control gate 58 over dielectric layer 52 so that the horizontal nanocrystals are, at the closest point, a thickness 56 from control gate 58. Control gate 58, in areas between the horizontal nanocrystals, is a further distance from the nanocrystals than thickness 56. Thus the contribution to the capacitance between control gate 58 and the nanocrystals is lessened by the top surface of dielectric 52 being substantially planar.

Figure 8:
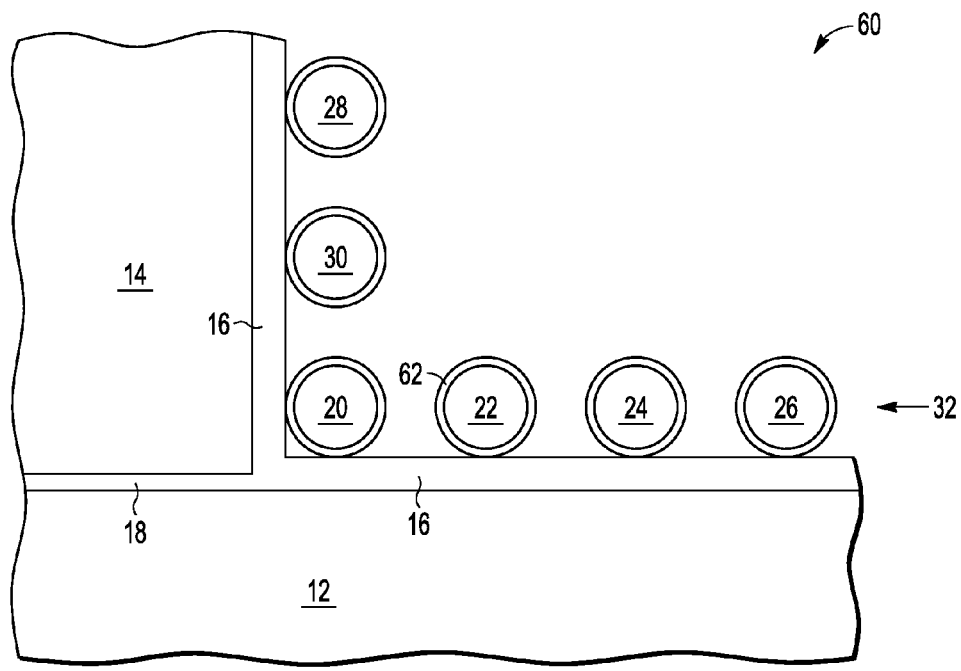
FIG. 8 is a cross section of an NVM cell structure at a stage in processing according to a third embodiment.

Shown in FIG. 8 is an NVM cell structure 60 after growing a thin oxide layer 62 on nanocrystals 32. Oxide layer 62 is shown, by way of example, on nanocrystal 22. Oxide layer 62 may be about 20 Angstrom thick. Layer 62 is particularly convenient to be grown oxide because of the control in terms of thickness and high quality of the resulting layer of such a process. It may be possible to provide a protective layer using a different material such as nitride. Oxide layer 62 may also adhere particularly well to a subsequently deposited hot temperature oxide layer.

Figure 9:
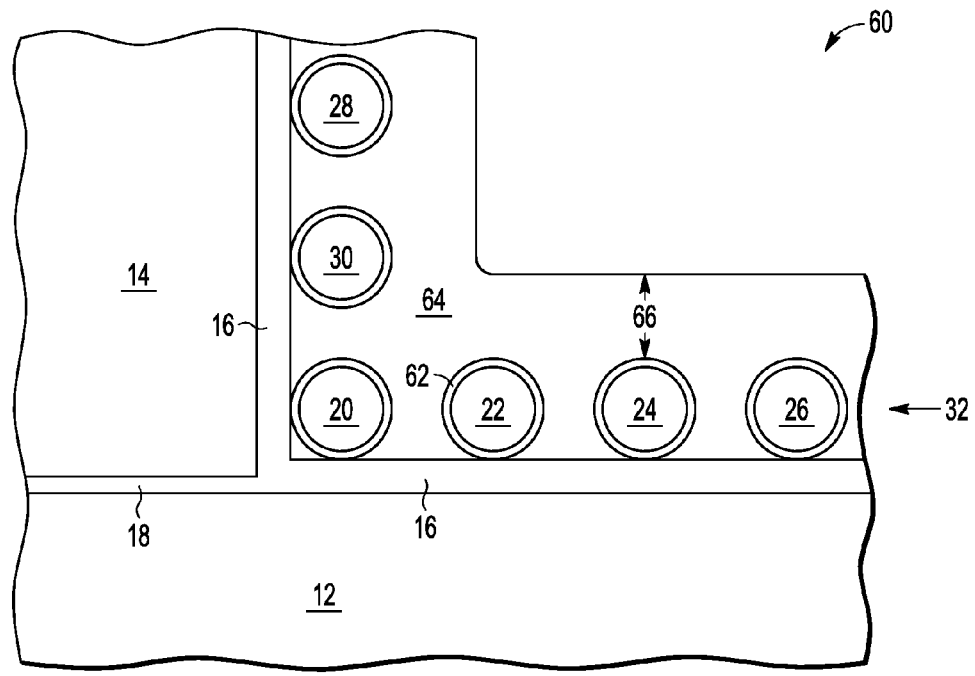
FIG. 9 is a cross section of the NVM cell structure of FIG. 8 at a subsequent stage in processing.

Shown in FIG. 9 is NVM cell structure 60 after depositing a planar layer of high temperature oxide having a thickness 66 directly over the horizontal nanocrystals such as nancrystal 22. With oxide layer 62 coating the nanocrystals, there is additional protection for the nanocrystals so that the likelihood the planar high temperature oxide deposition will be sufficient. Thickness 66 may be about 60 Angstroms so that the total of thickness 66 and the thickness of oxide layer 62 is about 80 Angstroms.

Figure 10:
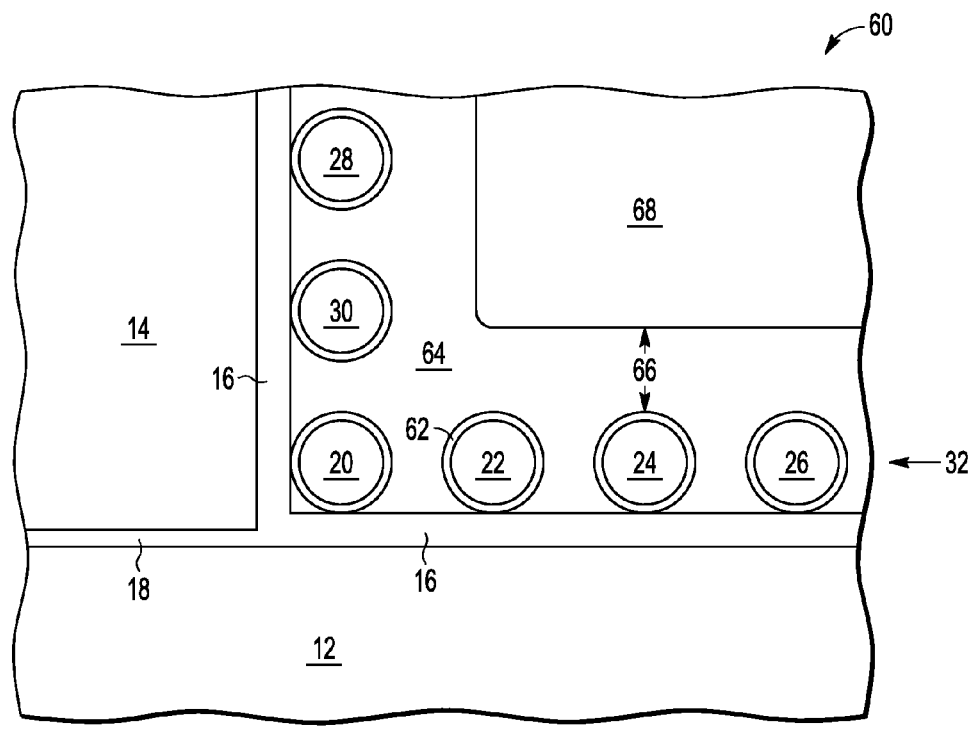
FIG. 10 is a cross section of the NVM cell structure of FIG. 9 at a subsequent stage in processing.

Shown in FIG. 10 is NVM cell structure 60 after forming a control gate 68 over dielectric layer 68. This shows that control gate 68, at the closest points to the nanocrystals, is distance 66 from the nanocrystals but is further than that distance in the areas between nanocrystals.

Figure 11:
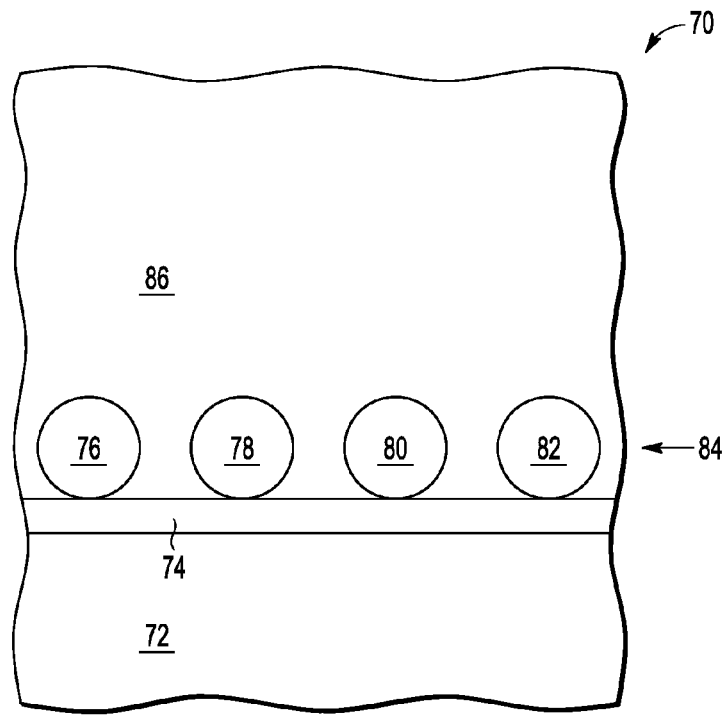
FIG. 11 is a cross section of an NVM cell structure at a stage in processing according to a fourth embodiment.

Shown in FIG. 11 is an NVM cell structure 70 having a substrate 72, a dielectric layer 74 over substrate 72, a plurality of nanocrystals 84, and a dielectric layer 86 over dielectric layer 74 and around and above nanocrystals 84. Nanocrystals 84 comprise nanocrystals 76, 78, 80, and 82. Dielectric layer 86 may be formed by a deposition of conformal high temperature oxide and may be 250 Angstroms thick.

Figure 12:
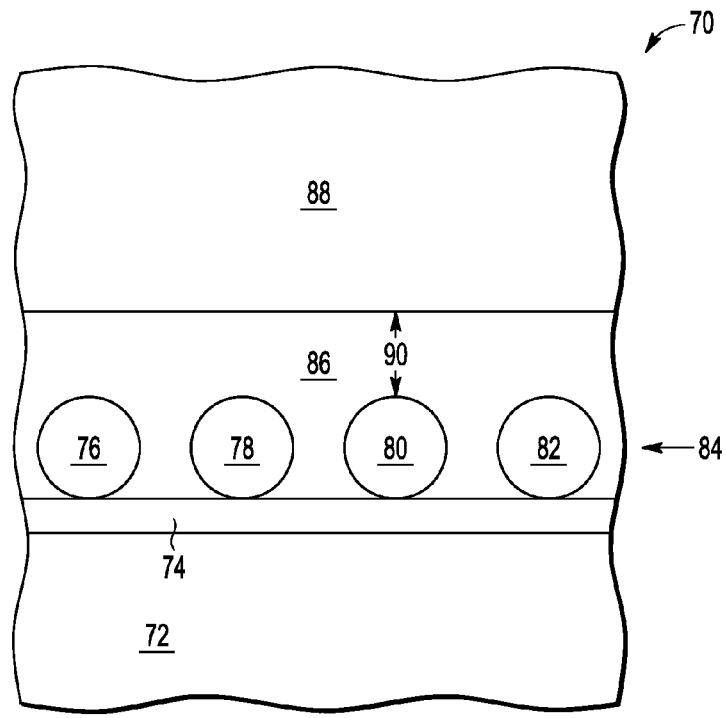
FIG. 12 is a cross section of the NVM cell structure of FIG. 11 at a subsequent stage in processing.

Shown in FIG. 12 is NVM cell structure 70 after performing chemical mechanical polishing (CMP) to reduce the thickness of dielectric layer 86 over nanocrystals 84 to a thickness 90 which may be about 80 Angstroms. Also shown in FIG. 12 is a control gate 88 formed over dielectric layer 86. Similar to previously described NVM cell structures, the distance between nanocrystals to the control gate is further than from the area directly over the nanocrystals. This reduces capacitance between the control gate and the nanocrystals for a given minimum distance such as distance 90 where the nanocrystals are directly under control gate 88.

Figure 13:
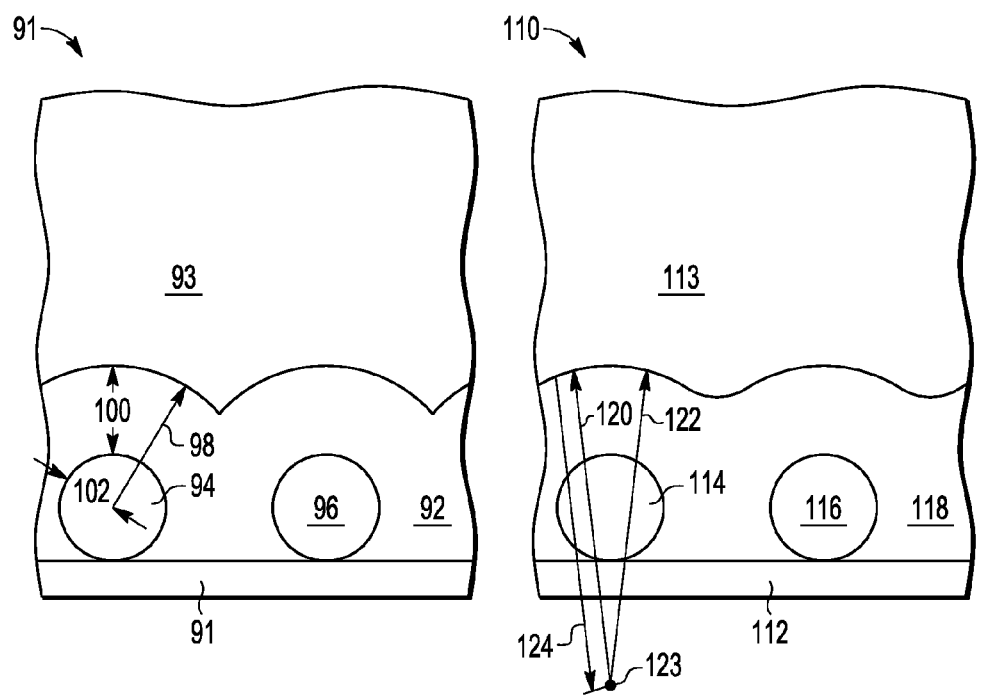
FIG. 13 is a cross section of a pair of NVM cell structures useful in understanding the embodiments.

Shown in FIG. 13 is a pair of cross section of possible NVM cell structures 91 and 110 for demonstrating a radius of curvature for a substantially planar surface as used herein. NVM cell structure 91 has a conformal dielectric over nanocrystals 94 and 96, a dielectric 92 that is conformal, and a control gate 93 over dielectric 92. Shown is a radius 98 from the center of nanocrystal 94 to control gate 93. This radius is the sum of a distance 102 from the center of nanocrystal 94 to its surface and a distance 100 from the top surface of nanocrystal to control gate 93. For the substantially planar case, the radius is at least twice that of radius 98 as shown in FIG. 13 for NVM cell structure 110 having nanocrystals 114 and 116 on a dielectric layer 112. Shown are two equal radii defining a locus between them along the interface between a dielectric layer 118, which is on dielectric 112 and over and nanocrystals 114 and 116, and a control gate 113. This shows a common point 123 as one terminal of the radii and that each radius spans a distance 124. Thus, when the radius of curvature is more than twice the radius of the nanocrystal plus the vertical distance from the nanocrystal to the control gate, the top surface of the dielectric layer is considered substantially planar. If the top surface is perfectly planar, which may appear to be the case in the case of using CMP, then the radius is considered infinite.

Thus it is shown that an NVM memory cell can have a substantially planar surface which results in less capacitance between the nanocrystals and the control gate for a given minimum distance between the nanocrystals and the control gate. The reduced capacitance results in allowing for a more electron tunneling out of the nanocrystals to the control gate, top side tunneling, prior to the tunneling from the substrate to the nanocrystals becoming equal to the top side tunneling. In effect, the applied erase voltage to the control gate has a bottom side portion between the substrate and the nanocrystals and a top side portion between the nanocrystals and the control gate. The ratio of the voltage across the top side and bottom side portions is based on the capacitance ratio at these portions. By reducing the top side capacitance by having a control gate with a bottom surface with increased planarity, the percentage of the applied erase voltage that is between the control gate and the nanocrystals is increased. This similarly means that the bottom side voltage is decreased. The increase in top side voltage means increased tunneling where it is desired between the control gate and the nanocrystals and the decrease in bottom side voltage means decreased tunneling where it is not desired between the substrate and the nanocrystals. This may be allow for the benefits of some combination of reduced erase voltage, reduced erase time, and a greater differential between the erased state and the programmed state.

By now it should be appreciated that there has been provided a non-volatile memory device having a substrate and a charge storage layer. The charge storage layer includes a bottom layer of oxide, a layer of discrete charge storage elements on the bottom layer of oxide, and a top layer of oxide on the discrete charge storage elements. The non-volatile memory device further includes a control gate on the top layer of oxide, wherein a surface of the top layer of oxide facing a surface of the control gate is substantially planar. The device may have a further characterization by which a radius of curvature of the top layer of oxide over a majority of the discrete charge storage elements is at least twice a sum of a radius of the discrete charge storage element and a thickness of the top layer of oxide. The device may further include a select gate, wherein a portion of: the bottom layer of oxide, the discrete charge storage elements, and the top layer of oxide, are between one side of the control gate and one side of the select gate. The device may further include a thin layer of oxide on an outer surface of the charge storage elements. The device may further include a thickness of the top layer of oxide over at least one of the charge storage elements is less than a diameter of the at least one charge storage element.

Also disclosed is a method of making a non-volatile memory device. The method includes forming a first electrically insulating material on a substrate. The method further includes forming discrete charge storage elements on the first electrically insulating material. The method further includes depositing a second electrically insulating material over the discrete charge storage elements, wherein a top surface of the second electrically insulating material is substantially planar. The method may further include forming a control gate over the second electrically insulating material. The method may further include forming a select gate over a third insulating material. The method may have a further characterization by which a radius of curvature of the second electrically insulating material over one of the discrete charge storage elements is at least twice a sum of a radius of the one discrete charge storage element and a thickness of the second electrically insulating material. The method may further include growing an oxide layer on the discrete charge storage elements before depositing the second electrically insulating material. The method may have a further characterization by which a thickness of the second electrically insulating material over at least one of the discrete charge storage elements is less than a diameter of the at least one discrete charge storage element. The method may further include chemically-mechanically polishing the second electrically insulating material to be substantially planar. The method may further include depositing a conformal layer of electrically insulating material on the discrete charge storage elements before depositing the second electrically insulating material. The method may further include etching the second electrically insulating material to be substantially planar.

Disclosed also is a method that includes forming a first oxide layer on a substrate. The method further includes forming discrete charge storage elements on the first oxide layer. The method further includes forming a second oxide layer that is planar on the discrete charge storage elements having a thickness that is less than a diameter of the charge storage elements. The method may have a further characterization by which the diameter of the discrete charge storage elements is between 10 to 20 nanometers and the thickness of the second oxide layer over the charge storage elements is between 6 and 10 nanometers. The method may further include depositing a conformal oxide layer on the charge storage elements before depositing the second oxide layer. The method may further include chemically-mechanically polishing the second oxide layer. The method may have a further characterization by which a radius of curvature of the second oxide layer over the discrete charge storage elements is at least twice a sum of a radius of the discrete charge storage elements and a thickness of the second oxide layer. The method may further include etching the second oxide layer.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the particular thicknesses given can be varied as can the particular materials. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A non-volatile memory device comprising:
   a substrate;
   a charge storage layer comprising:
      a bottom layer of oxide;
      a layer of discrete charge storage elements on the bottom layer of oxide;
      a top layer of oxide on the discrete charge storage elements; and
   a control gate on the top layer of oxide, wherein a surface of the top layer of oxide facing a surface of the control gate is substantially planar, and wherein a radius of curvature of the top layer of oxide over a majority of the discrete charge storage elements is at least twice a sum of a radius of the discrete charge storage element plus a thickness of the top layer of oxide.

2. The device of claim 1, further comprising:
   a select gate, wherein a portion of: the bottom layer of oxide, the discrete charge storage elements, and the top layer of oxide, are between one side of the control gate and one side of the select gate.

3. The device of claim 1, further comprising:
a thin layer of oxide on an outer surface of the charge storage elements.

4. The device of claim 1, further comprising:
a thickness of the top layer of oxide over at least one of the charge storage elements is less than a diameter of the at least one charge storage element.

5. A method of making a non-volatile memory device comprising:
forming a first electrically insulating material on a substrate;
forming discrete charge storage elements on the first electrically insulating material; and
depositing a second electrically insulating material over the discrete charge storage elements, wherein a top surface of the second electrically insulating material is substantially planar, wherein a radius of curvature of the second electrically insulating material over one of the discrete charge storage elements is at least twice a sum of a radius of the one discrete charge storage element plus a thickness of the second electrically insulating material.

6. The method of claim 5, further comprising forming a control gate over the second electrically insulating material.

7. The method of claim 5, further comprising forming a select gate over a third insulating material.

8. The method of claim 5, further comprising growing an oxide layer on the discrete charge storage elements before depositing the second electrically insulating material.

9. The method of claim 5, wherein a thickness of the second electrically insulating material over at least one of the discrete charge storage elements is less than a diameter of the at least one discrete charge storage element.

10. The method of claim 5, further comprising chemically-mechanically polishing the second electrically insulating material to be substantially planar.

11. The method of claim 5, further comprising depositing a conformal layer of electrically insulating material on the discrete charge storage elements before depositing the second electrically insulating material.

12. The method of claim 5, further comprising etching the second electrically insulating material to be substantially planar.

13. A method comprising:
forming a first oxide layer on a substrate;
forming discrete charge storage elements on the first oxide layer; and
forming a second oxide layer that is planar on the discrete charge storage elements having a thickness that is less than a diameter of the charge storage elements, wherein a radius of curvature of the second oxide layer over the discrete charge storage elements is at least twice a sum of a radius of the discrete charge storage elements plus a thickness of the second oxide layer.

14. The method of claim 13, wherein the diameter of the discrete charge storage elements is between 10 to 20 nanometers and the thickness of the second oxide layer over the charge storage elements is between 6 and 10 nanometers.

15. The method of claim 13, further comprising depositing a conformal oxide layer on the charge storage elements before depositing the second oxide layer.

16. The method of claim 13, further comprising chemically-mechanically polishing the second oxide layer.

17. The method of claim 13, further comprising etching the second oxide layer.

\* \* \* \* \*